United States Patent [19]
Boucher

[11] Patent Number: 4,850,559
[45] Date of Patent: Jul. 25, 1989

[54] MARINE INSTRUMENT MOUNTING MECHANISM

[75] Inventor: Stephen G. Boucher, Amherst, N.H.

[73] Assignee: Airmar Technology Corporation, Milford, N.H.

[21] Appl. No.: 249,968

[22] Filed: Sep. 27, 1988

[51] Int. Cl.$^4$ .............................................. E04G 3/00
[52] U.S. Cl. .................................. 248/286; 248/293; 367/173
[58] Field of Search ............ 248/286, 674, 291, 292.1, 248/293, 294, 240.4, 900; 367/173

[56] References Cited

U.S. PATENT DOCUMENTS

| | | | |
|---|---|---|---|
| 1,719,922 | 7/1929 | Chapman | 248/293 |
| 2,069,067 | 1/1937 | Hoffman | 248/293 |
| 3,082,623 | 3/1963 | Bosland | 248/291 |
| 3,521,225 | 7/1970 | Kursman | 367/173 |
| 3,714,619 | 1/1973 | Morgan | 248/291 X |
| 3,729,162 | 4/1973 | Salvato | 367/173 X |
| 3,752,431 | 8/1973 | McBride | 367/173 X |
| 3,981,470 | 9/1976 | Rutili | 248/291 |
| 4,206,898 | 6/1980 | Salter | 248/542 X |
| 4,667,915 | 5/1987 | Bovcher | 248/293 |

*Primary Examiner*—J. Franklin Foss
*Attorney, Agent, or Firm*—Hamilton, Brook, Smith & Reynolds

[57] ABSTRACT

Mechanism for mounting a marine instrument (I) on a boat having a mounting block (12) and a pair of brackets (10) spaced from each other on opposite sides of the block (12). There are pivots (20) for mounting each bracket on the block for pivotal movement about a common axis (22). The marine instrument (I) is between the brackets. A spring (44) biases the brackets (10) and into forceable engagement with each other. Mating latch means (52-78) on the block and the brackets respectively retain the instrument in a first operative position. The mating latch means are disengageable to permit the instrument to be pivoted to an inoperative position.

21 Claims, 4 Drawing Sheets

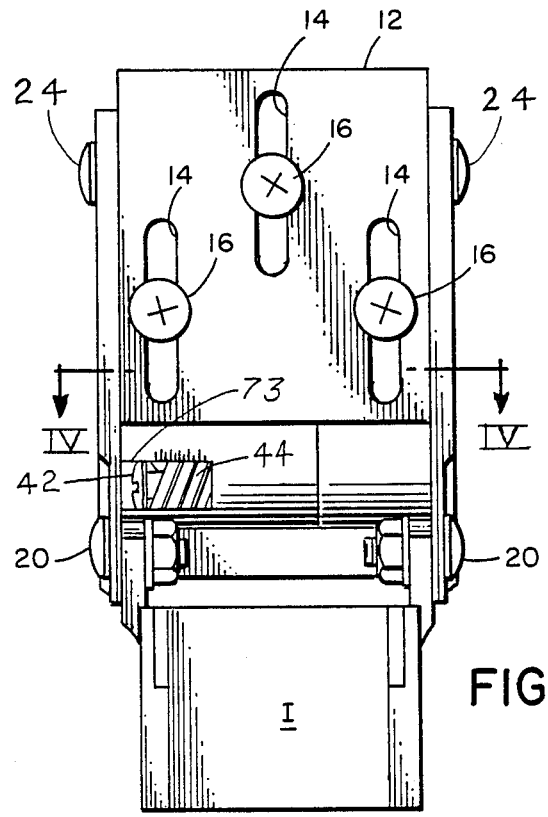
FIG. 2
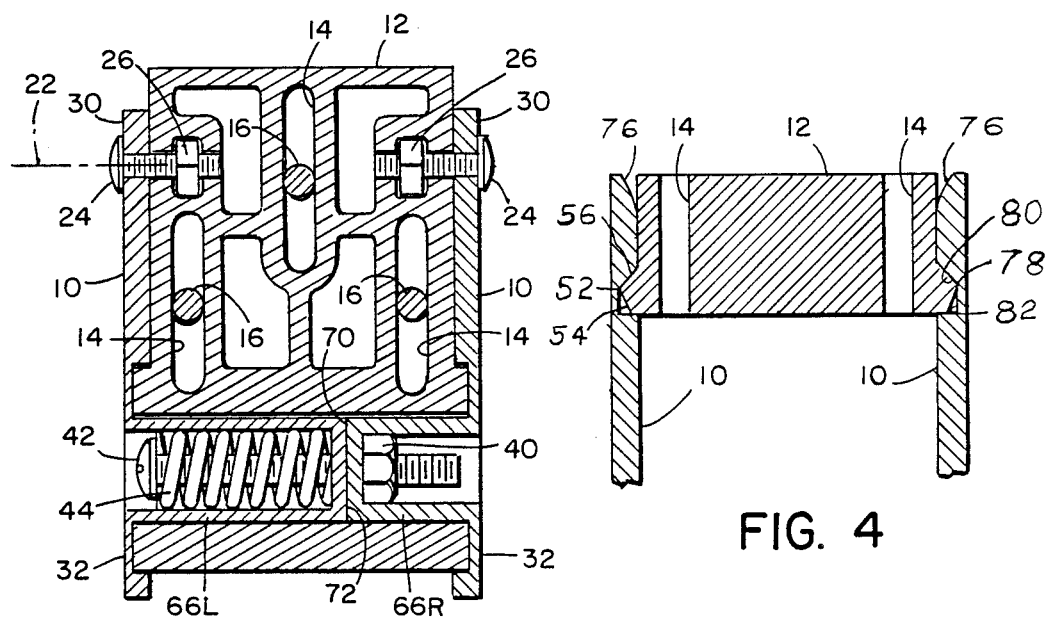
FIG. 3
FIG. 4

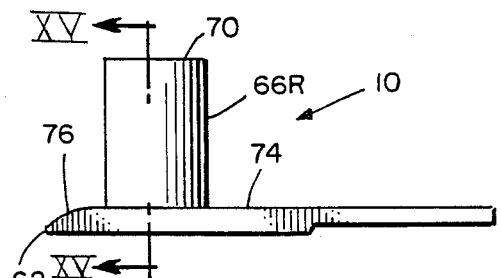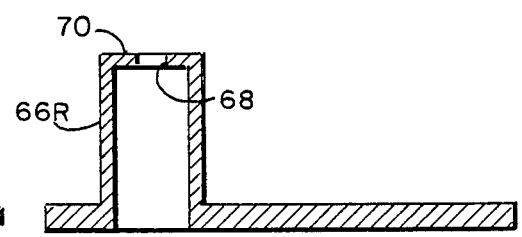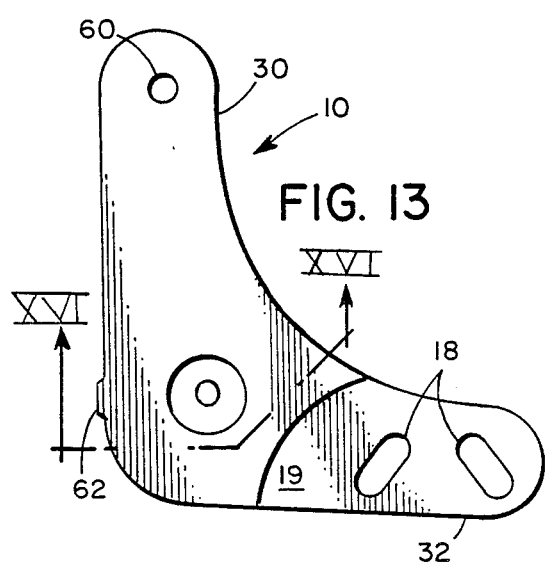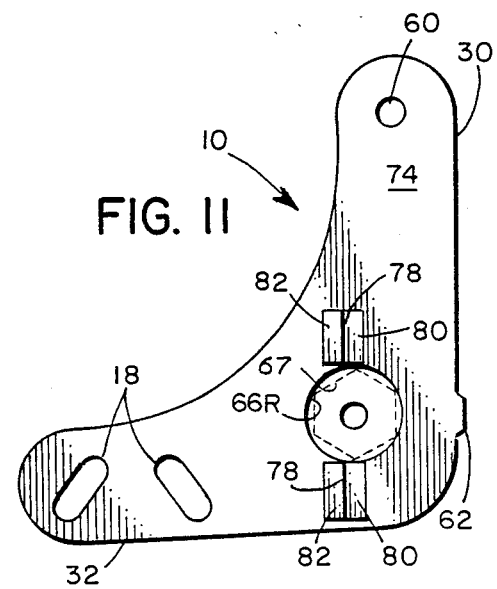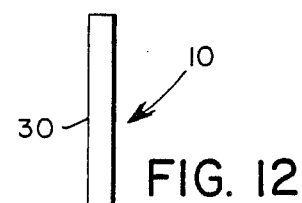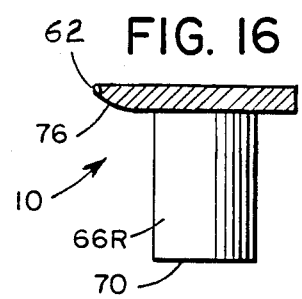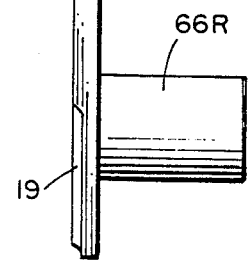

MARINE INSTRUMENT MOUNTING MECHANISM

FIELD OF THE INVENTION

This invention relates to mechanism for mounting marine instruments, such as speed or depth measuring devices, on the hulls of boats. It is directed more particularly to mounting mechanism which permits the instrument to move out of its operative position if it is struck by a submerged or floating object. It can also be moved manually, if desired.

BACKGROUND OF THE INVENTION

Mechanism of the above, broadly-described type is disclosed in U.S. Pat. 4,667,915, of which the present inventor is a co-inventor.

As is discussed in that patent, there are many types of marine instruments which measure water depth, boat speed, temperature and the like which exist today for amateur and/or professional boatsmen. These devices may measure any one of or any combination of speed, depth and temperature. Such devices are sold by the Airmar Technology Corporation of Amherst, N.H., which is assignee of U.S. Pat. 4,667,915 and of the present invention.

The marine instruments are sophisticated electronic devices and while they are not, per se, delicate, they can be damaged if they are struck a hard blow. They are exposed to such damage because they are normally located at or partially below the bottom of the hull of a boat. Often, the instrument is located on the transom of a boat and projects somewhat below the bottom to be sure that it is in a stream of bubble-free water or water which is free of aeration. In many instances, such instruments are used on high-speed boats as, for example, boats capable of obtaining 70 knots. Obviously, should a boat traveling at that speed strike a floating or submerged object, the instrument could be severely damaged or knocked from the boat.

Thus, one of the objects of the invention is to provide means for mounting such instruments on boats so that they will release if they strike a foreign object.

It is another object of the invention to provide a marine instrument mounting mechanism which can readily be reset in the operative position after it has been either intentionally or accidentally moved to an inoperative position.

Another object of this invention is to provide a mounting mechanism which will permit the marine instrument to be moved manually to an inoperative or safer position during the process of storing, launching, or the like.

It is still another object of this invention to provide a marine instrument mounting mechanism which is similar to that disclosed in U.S. Pat. No. 4,667,915, and which is less complicated and can be produced for less cost.

It is still another object of the invention to provide a mounting mechanism which is substantially universal and which may accept any one of a plurality of instruments, such as speed, depth, or temperature indicators or combinations thereof.

SUMMARY OF THE INVENTION

The invention resides in mechanism for mounting a marine instrument on a boat. It includes a mounting block which is adjustably securable to a boat, preferably to the transom. There are a pair of brackets on opposite sides of the block. The brackets are substantially L-shaped and are mounted on the block for pivotal movement about a common axis. The pivot point may be in the first of the two legs of the L-shaped bracket. A marine instrument is mounted between the brackets and may be located between the second legs.

There are spring means which bias the brackets toward each other and into forceable engagement with the block. Means associated with the spring means are provided to permit the spring to be observed to visably determine the amount of bias. There are mating latch means on the block and on the brackets to releasably latch the instrument in a first operative position. The latch means are automatically disengageable with each other to permit the instrument to be pivoted to an inoperative position should strike a foreign object such as a floating or sunken log or it can be manually disengaged in launching or in storing.

The position of the mounting block relative to the boat may be adjusted as may the position of the instrument relative to the brackets that are on the block. The spring means are adjustable to control the force required to urge the brackets apart thereby to disengage the latching means between the block and the brackets.

The latching means are substantially a projection and an indentation on either or both the brackets and the block and are engageable with each other. They are so shaped to include at least one camming surface on one member engageable with a mating camming surface on the other member, which surfaces slide on each other when the instrument moves to and from the operative position.

The above and other features of the invention including various novel details of construction and combinations of parts will now be more particularly described with reference to the accompanying drawings and pointed out in the claims. It will be understood that the particular marine instrument mounting mechanism embodying the invention is shown by way of illustration only and not as a limitation of the invention. The principles and features of the invention may be employed in varied and numerous embodiments without departing from the scope of the invention.

BRIEF DESCRIPTION OF THE DRAWINGS

FIG. 2 is a rear view thereof.

FIG. 3 is a sectional view taken along the line III—III on FIG. 1.

FIG. 4 is a sectional view taken along the line IV—IV on FIG. 2.

FIG. 11 is an inside view of one of the mounting brackets.

FIG. 12 is a rear view thereof.

FIG. 13 is an outside view thereof.

FIG. 14 is a top view thereof.

FIG. 15 is a sectional view taken along the line XV—XV on FIG. 14, and

FIG. 16 is a sectional view taken along the line XVI—XVI on FIG. 13.

DETAILED DESCRIPTION OF THE INVENTION

Figure 1:
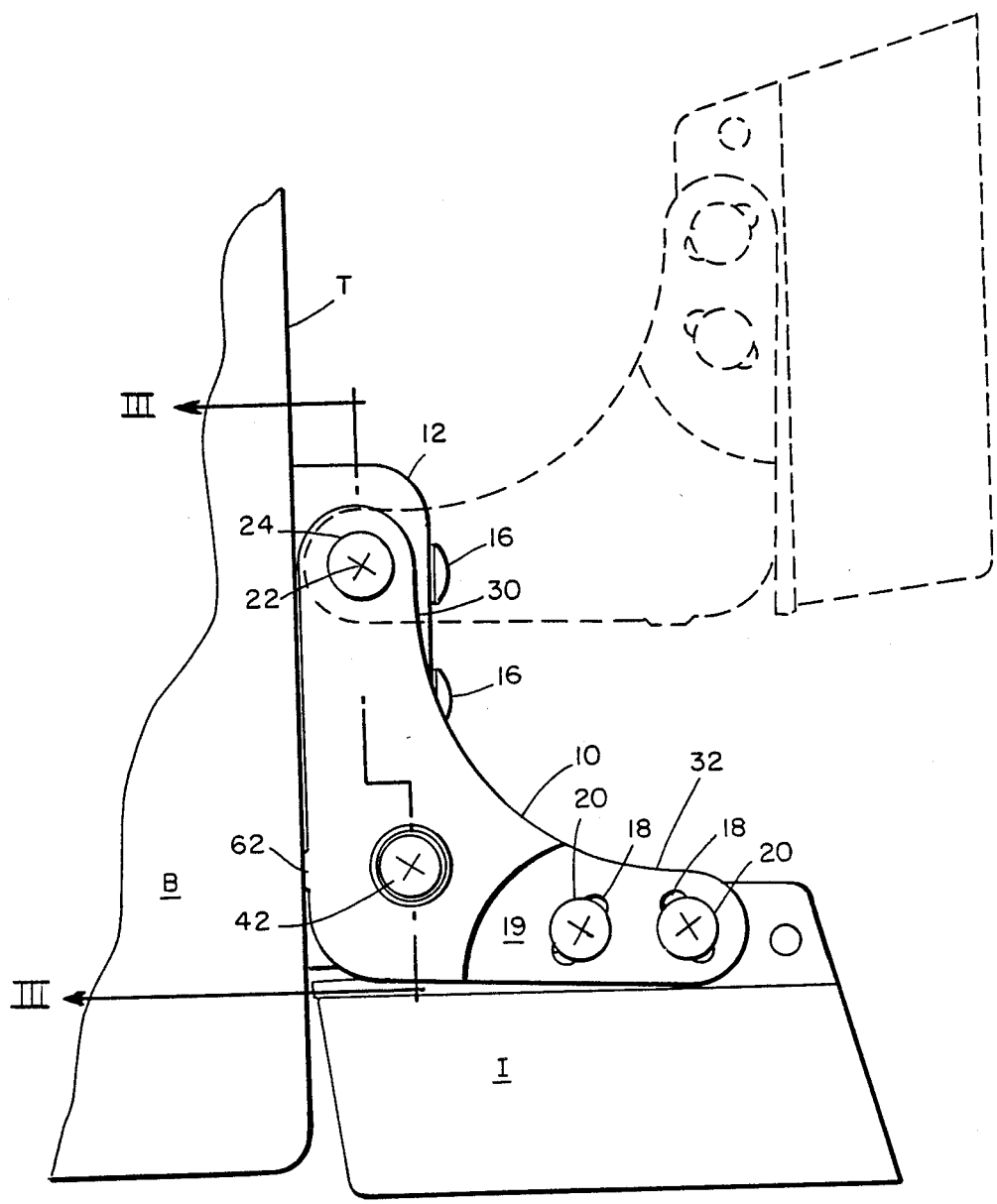
FIG. 1 is a side elevation of a marine instrument mounting mechanism embodying the features of the present invention and shown in solid line in the operative position and in dotted line in the inoperative position.
Figure 8:
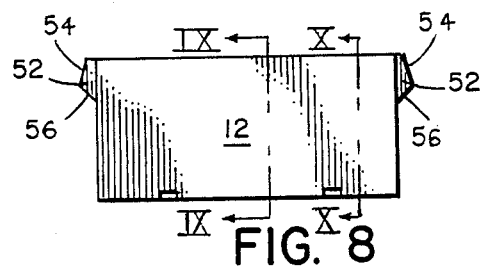
FIG. 8 is a top view thereof.

Referring initially to FIG. 1, a marine instrument I, which may be for example, a speed, depth, or temperature measuring device, or any combination thereof, is shown secured to the transom T of a boat B. The instrument I projects slightly below the bottom of the boat to assure that it is in a stream of bubble free water or water which is as free as possible of aeration. The instrument is secured between brackets 10, only one of which is seen in FIG. 1, the other being behind it, for pivotal movement on a mounting block 12 between the solid and dotted line positions. The solid line position is the operative position and the dotted line position is the inoperative position. If, when the instrument I is in the operative position, it strikes a floating or submerged object, or if the drag force on the instrument, caused by the speed of the boat relative to the water, exceeds a predetermined amount, it will disengage adjustable latching means (hereinafter to be described). It will then pivot upwardly to the dotted line position from which it can then be reset to the operative position. Parenthetically, drag force is a function of the square of the speed of the boat. Furthermore, should it be desired to move the instrument I upwardly into the inoperative position as, for example, during launching or in preparation for storage or when it would otherwise be susceptible to damage, it may be pulled upwardly manually.

As will be seen in FIGS. 1 and 2, the mounting block 12 may be adjusted heightwise relative to the boat B by adjusting means including vertical slots 14 formed in the block which receive locking screws 16. Loosening the screws permits the block to be raised or lowered. In like manner, the height of the instrument I, as well as its angle relative to the brackets 10, may be adjusted along diagonal slots 18 through which pass clamping bolts 20.

The brackets 10, which are spaced from each other on opposite sides of the mounting block 12, pivot about a common axis 22 defined by bolts 24. The bolts are secured in the block 12 and are threaded onto nuts 26 (FIG. 3) captured against rotation in the block 12. This mechanism assists in varying the force with which the insides of the brackets 10 engage the outsides of the block 12.

As will be seen in FIG. 1 the brackets 10 are substantially L-shaped, having an upper leg 30 and a lower leg 32, also known as the first and second legs respectively. The first legs 30 pivot on the block 10 and the second or lower legs 32 mount the instrument I between them. As will be seen in FIG. 3, the brackets 10 are held together by a nut 40, a bolt 42 and a compression spring 44 all of which will be discussed in greater detail hereinafter.

Figure 5:
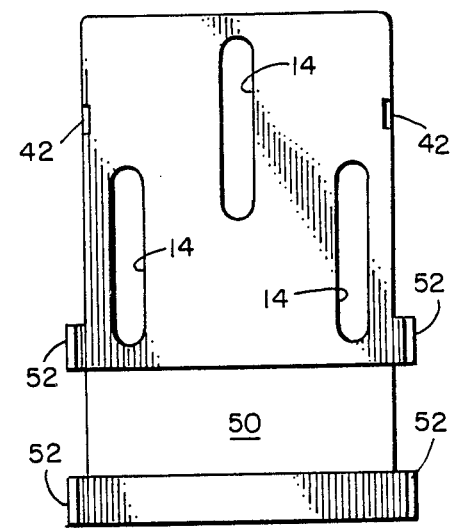
FIG. 5 is a rear elevation of the mounting block of the mounting mechanism.
Figure 7:
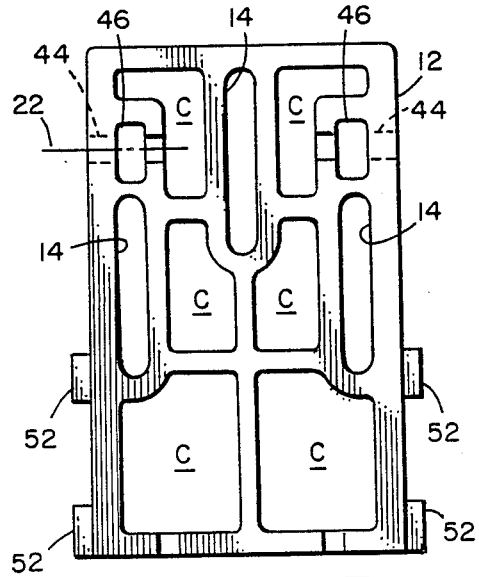
FIG. 7 is a front elevation thereof.
Figure 6:
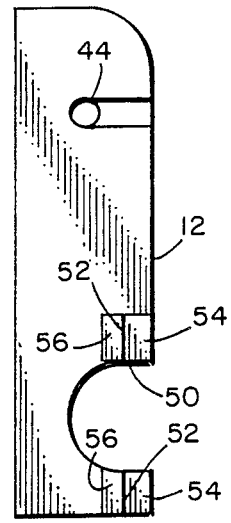
FIG. 6 is a left side elevation thereof.

Details of construction of the mounting block 12 will be seen in FIGS. 5 to 10. FIG. 5 is a view of the block 12 from the rear or that portion which faces away from the boat. FIG. 6 shows the edge of the block and FIG. 7 shows the front of the block or that surface which is mounted on the transom of the boat.

The block, as well as the brackets, is made from thermoplastic material. Glass reinforced polypropylene has been found to be satisfactory as have thermoplastics sold under the trade names Nylon and Delrin.

Figure 10:
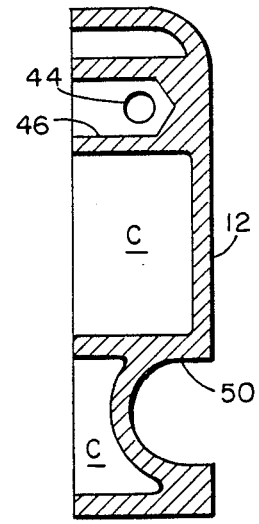
FIG. 10 is a sectional view taken along the line X—X on FIG. 8.

As seen in FIGS. 7 and 10, the block 12 includes bores 44 defining the pivotal axis 22 and receives the bolts 24 shown in FIG. 3. Enlarged openings 46, shaped as half hexigons to capture the hexigonal nuts 26, are formed along the bores 44 and prevent rotation of the nuts. Various cavities C are molded into the block 12 to reduce its weight.

Figure 9:
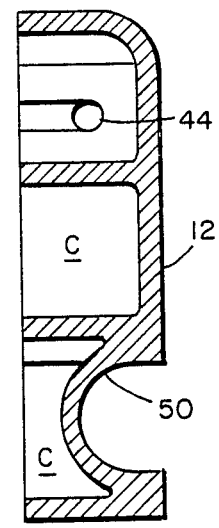
FIG. 9 is a sectional view taken along the line IX—IX on FIG. 8.

As will be seen in FIGS. 6, 9 and 10, near the bottom of the block 12 at its rear face, there is a substantially semicircular cavity 50 extending from side-to-side. Spaced both above and below the cavity 50 on both sides of the block are a pair of projections 52 which are substantially triangular. Each has camming surfaces 54, 56. The function of the projections 52 will be described in greater detail hereinafter.

Details of the brackets 10 will best be seen in FIGS. 11 through 16. As stated above, each bracket is substantially L-shaped in configuration having a first or upper leg 30 and a second or lower leg 32. As seen in FIG. 11 the upper leg includes a bore 60 for receiving the bolt 24 and the lower leg 32 includes the angled adjusting slots 18 which accept the clamping bolts 20. A projecting flat 62 is formed near the bottom of the leading edge of the leg 30. As seen in FIG. 1 the projecting flat 62 is engageable with the transom T of the boat to space the remainder of the brackets away from the transom to prevent undue scratching, etc. Also formed on the leg 30 is a reduced flat 19, through which the slots 18 are formed and against which the instrument I bears.

A hollow cylinder 66 projects inwardly from the bracket and contains a bore 68 (FIG. 15) to accommodate the bolt 42 shown in FIG. 3. The interior of one of the hollow cylinders 66 accommodates the compression spring 44. It will be noted from FIG. 3 that the hollow cylinder 66L which is formed on the left bracket is longer than the hollow cylinder 66R which is formed on the righthand bracket. Cylinder 66L accommodates the spring 44 and cylinder 66R captures the nut 40 in an internal hexigonal recess 67 (FIG. 11) to prevent rotation. The bolt 42 passes between the cylinders 66R and 66L. As seen in FIG. 3, the closed end 70 of the hollow cylinder 66R abuts a corresponding closed end 72 on the cylinder 66L.

A slot 73 is formed in the cylinder 66L to permit a portion of the bolt 42 and the spring 44 to be observed to visably determine the degree of spring pressure biasing the brackets together. When the head of the bolt aligns with the end of the slot 73 the spring is compressed to an amount to supply the maximum desirable release force. Total compression of the spring obviously would not permit the brackets to open since the bolt 24 would clamp them together against movement.

Formed on the inside surface 74 (FIG. 14) at the nose of the bracket 10 is a camming surface 76. Also formed on the inside surface 74 of the bracket 10 are a pair of indentations 78 (FIGS. 4 and 11), each of which having sloping camming surfaces 80 and an inner wall 82.

The marine instrument mounting mechanism is assembled and operates in the following manner. With particular reference to FIGS. 1, 2 and 3, the upper legs 30 of the brackets will be seen mounted for pivotal movement on the common axis 22 of the block 12. The instrument I is adjustably secured between the lower legs 32 of the brackets by the clamping bolts 20 in the slots 18. The spring 44 (FIG. 3) is located in the hollow cylinder 66L with the bolt 42 passing through the closed ends 70 and 72 of the cylinders 66L and 66R. The nut 40 and the bolt 42 are tightened to a predetermined amount as viewed through the slot 73 to hold the surfaces 70 and 72 in engagement with each other. The brackets are pivoted into the operative or FIG. 1 solid line position with the camming surfaces 76 on the brackets 10 riding over the mating surfaces 54 on the projections 52 on the block 12. The cylinders 66L and 66R are then accommodated within the semicircular cavity 50 in the bracket 12. The surfaces 82 in the indentation 78 are then in engagement with the surfaces 56 on the projections 52 on the block 12. In the operative position, the projecting flats 62 on the brackets 10 are in engagement with the transom T of the boat.

It will be appreciated that within the scope of the invention, the projections 52 and the indentations 78 may be reversed in position, e.g., the projections may be on brackets 10 and the indentations on the block. Similarly, there may be projections on both members that interlock.

If the instrument I strikes a foreign object such as a floating or sunken log, or if the boat speed exceeds a predetermined amount causing excessive drag on the instrument I, the instrument and hence its mounting brackets 10 are forced rearwardly and upwardly from the solid to the dotted line position shown in FIG. 1. The brackets 10 are urged apart against the force of the spring 44 as the camming surfaces 80 of the indentations 78 on the brackets 10 slide outwardly on the surfaces 56, on the projections 52 on the mounting bracket 12. Upon their apexes passing each other, they release and the brackets 10 again are urged together by the spring 44 as the instrument I moves toward the inoperative position. Thereafter the instrument may be reset simply by pushing it downwardly into the latched or operative position.

The degree of force necessary to unlatch the block is controlled by adjusting the tension of the spring 44 which is compressed by rotating the screw 42. The amount of compression is viewed through the slot 73. The angular disposition of the instrument I relative to the brackets 10 is controlled by the position of the bolts 20 within the slots 18 and the heightwise adjustment of the block 12, hence the instrument I relative to the transom T of the boat, is controlled by the position of the bolts 16 relative to the slots 14.

I claim:

1. Mechanism for mounting a marine instrument on a boat comprising:
   a mounting block securable to a boat,
   a pair of brackets spaced from each other on opposite sides of the block,
   means for mounting each bracket on the block for pivotal movement about a common axis,
   means for mounting a marine instrument between the brackets,
   spring means biasing the brackets toward each other in a direction substantially parallel with the common axis and into forceable engagement with the block,
   mating latch means on the block and the brackets to releasable retain the instrument in a first operative position, the mating latch means being disengageable to permit the instrument to be pivoted to an inoperative position.

2. Mounting mechanism according to claim 1 wherein there are means to adjust the position of the block relative to the boat.

3. Mounting mechanism according to claim 1 wherein there are means to adjust the position of the instrument relative to the brackets.

4. Mounting mechanism according to claim 1 wherein the spring means is an adjustable compression spring acting between the brackets.

5. Mounting mechanism according to claim 1 wherein the latch means comprise a projection and an indentation.

6. Mounting mechanism according to claim 1 wherein there is at least one projection on a bracket which is engageable with the boat to space the remainder of the bracket from the boat.

7. Mounting mechanism according to claim 1 wherein there are means associated with the brackets to visably observe the spring means to determine its amount of bias.

8. Mechanism for mounting a marine instrument on a boat comprising:
   a mounting block securable to a boat,
   a pair of substantially L-shaped brackets spaced from each other on opposite sides of the block,
   each bracket having a first leg and a second leg,
   means for mounting the first leg of each bracket on the block for pivotal movement about a common axis,
   means mounting a marine instrument between the second legs of the brackets,
   cooperative, releasable, latch means between the block and the brackets, and
   spring means biasing the brackets toward the block in a direction substantially parallel with the common first axis to forceably urge the latch means into engagement.

9. Mounting mechanism according to claim 8 wherein there are means to adjust the position of the block relative to the boat.

10. Mounting mechanism according to claim 8 wherein there are means to adjust the position of the instrument relative to the brackets.

11. Mounting mechanism according to claim 8 wherein the spring means is an adjustable compression spring acting between the brackets.

12. Mounting mechanism according to claim 8 wherein the latch means comprise a projection and an indentation.

13. Mounting mechanism according to claim 8 wherein there is at least one projection on a bracket which is engageable with the boat to space the remainder of the bracket from the boat.

14. Mounting mechanism according to claim 8 wherein there are means associated with the brackets to visably observe the spring means to determine its amount of bias.

15. Mechanism for mounting a marine instrument on a boat comprising:
   a mounting block securable to a boat,
   a pair of brackets spaced from each other on opposite sides of the block,
   means for mounting each bracket on the block for pivotal movement about a common axis,
   means for mounting a marine instrument between the brackets,
   releasable latching mean comprising male and female self-engaging member on the brackets and the block,
   spring means biasing the brackets toward each other and toward the block in a direction substantially parallel with the common axis such that the latching means engage with each other to maintain the instrument in an operative position, the engaging means being disengageable form each other against the force of the spring means to permit the instrument to be pivoted to an inoperative position.

16. Mounting mechanism according to claim 15 wherein there are means to adjust the position of the block relative to the boat.

17. Mounting mechanism according to claim 15 wherein there are means to adjust the position of the instrument relative to the brackets.

18. Mounting mechanism according to claim 15 wherein the spring means is an adjustable compression spring acting between the brackets.

19. Mounting mechanism according to claim 15 wherein each of the male and the female members has at least one camming surface which is engageable with a camming surface of its mating member and which camming surfaces slide on each other when the instrument moves to and from the operative position.

20. Mounting mechanism according to claim 15 wherein there is at least one projection on a bracket which is engageable with the boat to space the remainder of the bracket from the boat.

21. Mounting mechanism according to claim 15 wherein there are means associated with the brackets to visably observe the spring means to determine its amount of bias.

* * * * *